(12) United States Patent
Coronel et al.

(10) Patent No.: US 6,759,304 B2
(45) Date of Patent: Jul. 6, 2004

(54) DRAM MEMORY INTEGRATION METHOD

(75) Inventors: Philippe Coronel, Barraux (FR); Marc Piazza, Pontcharra (FR); François Leverd, St Ismier (FR)

(73) Assignee: STMicroelectronics SA, Montrouge (FR)

( * ) Notice: Subject to any disclaimer, the term of this patent is extended or adjusted under 35 U.S.C. 154(b) by 101 days.

(21) Appl. No.: 10/042,520

(22) Filed: Jan. 9, 2002

(65) Prior Publication Data

US 2002/0110976 A1 Aug. 15, 2002

(30) Foreign Application Priority Data

Jan. 18, 2001 (FR) .............................................. 01 00691

(51) Int. Cl.[7] .............................................. H01L 21/20
(52) U.S. Cl. .................... 438/386; 438/387; 438/396; 438/398; 438/238; 438/239; 438/399; 438/243; 438/244; 438/253; 438/260; 438/705; 438/738; 438/397; 257/296; 257/301
(58) Field of Search ................................ 438/386, 387, 438/396, 398, 238, 239, 399, 243, 244, 253, 260, 705, 738, 397; 257/296, 301

(56) References Cited

U.S. PATENT DOCUMENTS

| 5,206,183 A | * | 4/1993 | Dennison ..................... 438/253 |
| 5,338,700 A | * | 8/1994 | Dennison et al. ............. 438/253 |
| 5,488,011 A | | 1/1996 | Figura et al. .................. 437/60 |
| 5,498,562 A | * | 3/1996 | Dennison et al. ............ 438/253 |
| 5,500,384 A | | 3/1996 | Melzner ........................ 437/60 |
| 5,580,811 A | * | 12/1996 | Kim ............................ 438/253 |
| 5,654,236 A | * | 8/1997 | Kasai ......................... 438/639 |
| 5,776,815 A | * | 7/1998 | Pan et al. .................... 438/396 |
| 5,963,804 A | | 10/1999 | Figura et al. ............... 438/255 |
| 5,989,972 A | | 11/1999 | Widmann et al. ............ 438/397 |
| 6,100,156 A | | 8/2000 | Pan et al. .................... 438/396 |
| 6,524,927 B1 | * | 2/2003 | Sugawara et al. .......... 438/396 |

FOREIGN PATENT DOCUMENTS

EP 0581475 2/1994 ......... H01L/21/334

* cited by examiner

*Primary Examiner*—Matthew Smith
*Assistant Examiner*—Belur V Keshavan
(74) *Attorney, Agent, or Firm*—Lisa K. Jorgenson; Allen, Dyer, Doppelt, Milbrath & Gilchrist, P.A.

(57) ABSTRACT

The invention relates to a DRAM integration method that does away with the alignment margins inherent to the photoetching step of the upper electrode of the capacitance for inserting the bit line contact. The removal of the upper electrode is self-aligned on the lower electrode of the capacitance. This is accomplished by forming a difference in topography at the point where the opening of the upper electrode is to be made, and depositing a non-doped polysilicon layer on the upper electrode. An implantation of dopants is performed on this layer, and the part of the non-doped layer located in the lower part of the zone showing the difference in topography is selectively etched. The remainder of the polysilicon layer and the part of the upper electrode located in the lower layer are also etched.

25 Claims, 6 Drawing Sheets

DRAM MEMORY INTEGRATION METHOD

FIELD OF THE INVENTION

The present invention relates to electronics, and more particularly, to a method for making a dynamic random access memory (DRAM).

BACKGROUND OF THE INVENTION

A DRAM includes a plurality of memory cells. Each DRAM cell defined by a bit line and a word line, includes a semiconductor/dielectric/semiconductor type capacitance to store binary data and a transistor operating as a switch. In an overlay type DRAM cell architecture, the capacitance is formed above the transistor between the word line and the bit line. Such an architecture is shown in FIG. 1.

More particularly, each DRAM cell comprises a MOS type access transistor 3 with N⁺ dopant implantations 4. A contact block 5 enables the contact between the transistor and the capacitance. The capacitance is produced by lithoetching by making a slot in the silicon oxide TEOS, thus forming a ring 6 for the capacitance. The capacitance is formed by a lower electrode elec 1 and an upper electrode elec 2. Both electrodes are separated by a dielectric 7. Another contact block 8 is used to make the contact between the bit line 2 and the transistor 3.

To increase the surface for the capacitance without increasing the size of the ring 6, the lower electrode elec 1 is deposited in the form of hemispherical polysilicon grains according to a hemispherical grain polysilicon (HSG) method. This method makes it possible to double the surface, and therefore, the capacitance. The capacitance $C=\epsilon*S/E$, where E is the thickness of the dielectric, S the surface of the capacitance and E the dielectric constant.

However, in such an architecture, the size of the capacitance is limited by alignment tolerances which are necessary for the insertion of the bit line contact. Contact is prohibited between the capacitance and the bit line. In this way, when it is necessary to increase the integration density, i.e., to produce more memory cells in the same surface unit, the implementation of the contact 8 of the bit line becomes problematic. The corresponding explanation is given with reference to FIG. 2.

First of all, it is necessary to etch a wide opening 9 in the upper electrode plate elec 2 in the middle of the capacitance to insert the contact of the bit line 8. The photoetching step of the upper electrode uses a specific mask, which is referred to as elec 2 grid. This specific mask has very strict alignment constraints with respect to the alignment of an elec 1 grid mask used at the lower level to produce the opening of the capacitance.

A first alignment rule of the upper electrode elec 2 of the capacitance with respect to the lower electrode elec 1 must be observed. Photolithography technique limitations make it necessary to account for a minimum distance with reference as marked in FIG. 2, so that the electrode elec 2 never projects onto the electrode elec 1.

A preliminary step prior to the contact photoetching step includes depositing silicon oxide to fill the rings of the capacitances, and the opening produced in the upper electrode plate elec 2. The purpose of this step is to planarize the surface and prevent any contact between the capacitance and the bit line.

The next step includes etching the contact. This step requires the use of a specific contact mask referred to as a contact grid. The contact grid must also be perfectly aligned to be able to insert the contact at the center of the opening 9 previously produced in the electrode plate elec 2. This condition is imposed by the need to connect the contact 8 with a block 5 of the tungsten interconnection level which enables the contact with the transistor.

In addition, it is necessary to prevent the metal part of the contact 8 from coming into electrical contact with the upper electrode elec 2 of the capacitance. In this way, a second alignment rule of the contact with respect to the electrode plate elec 2 must be observed. This alignment rule makes it necessary to account for a minimum distance with the reference b as marked in FIG. 2 to protect the etching of the contact 8. This ensures that the dimensions of the contact grid are included in the dimensions of the elec 2 gird used to etch the opening of the electrode plate elec 2.

Therefore, the alignment rules that must be observed to produce the contact 8 of the bit line make it necessary to account for alignment margins a and b, respectively, which are specific to the limitations of the photolithography equipment used. Therefore, this architecture limits the integration capacity of DRAM memory cells. Any reduction in the dimensions of the cell should adhere to the alignment margins, which are inherent to the photolithography tools used. The size of the capacitance is thus limited by the two alignment tolerances required for the insertion of the bit line contact.

Therefore, unless improvements in the equipment enabling the alignment of the etching masks of one level with reference to another are considered, it is not possible to reduce any dimensions in the memory cell, and consequently, integration density will not be increased. Increasing integration density of DRAM cells is very important, particularly relating to embedded memories. Irrespective of the application, for an equivalent capacitance, it is important that the memory takes up as little space as possible on the chip on which it is embedded in order to integrate the maximum number of logic functions on the chip.

The drawback of the prior art architecture discussed above therefore hinders the development of DRAM applications given that they limit the integration density of the memory cells. Another disadvantage of the prior art architecture relates to the reliability of the application method. When the dimensions of the elec 2 grid are incorrect or when it is excessively offset, a recycling loop must be used before starting the etching step. Therefore, the architecture of the prior art results in limitations in terms of productivity and cycle time.

SUMMARY OF THE INVENTION

In view of the foregoing background, an object of the present invention is to provide a DRAM architecture which makes it possible to improve the integration density, and retain the same capacitance while making up for the drawbacks of the prior art.

This and other objects, advantages and features of the present invention are provided by the removal of the elec 2 grid in the insertion of the bit line contact, thus enabling the insertion to be avoided for new generations of photolithography equipment. The invention thus also represents a benefit in terms of cost reduction.

The DRAM cell architecture according to the invention makes it possible to do away with the alignment margin, which must normally be observed during the photoetching step of the upper electrode plate elec 2. To do this, the opening of the upper electrode elec 2 for the insertion of the bit line contact is self-defined with reference to the lower electrode elec 1 of the capacitance. The invention then makes it possible to carry out a self-alignment of elec 2 on elec 1, and thus carry out the etching of the opening in the upper electrode plate elec 2 without having to take any photos. This does away with the alignment constraints inherent to the positioning of the elec 2 grid with reference to the lower level.

Advantageously, the self-alignment of the removal of the upper electrode layer elec 2 on the lower electrode elec 1 is obtained by forming a difference in topography at the point where the opening of the upper electrode plate elec 2 is to be made for the insertion of the bit line contact.

Therefore, the invention relates to a DRAM memory integration method, where each memory cell, as defined by a bit line and a word line, comprises a storage capacitance and an access transistor. The method is characterized in that it comprises the following steps:

a) depositing a barrier layer followed by a silicon oxide layer;

b) photoetching the silicon oxide to define cylinders in which the capacitances are to be formed;

c) depositing a first polysilicon layer to form the lower electrode of the capacitances;

d) mechanical-chemical polishing to remove the polysilicon from the first layer between the capacitances;

e) removing part of the silicon oxide layer to create a difference in topography between each lower electrode and the silicon oxide layer;

f) depositing a dielectric layer;

g) depositing a second doped polysilicon layer to form a continuous upper electrode plate, the difference in topography being only retained in a zone where it is necessary to open the upper electrode plate to insert the bit line contact;

h) depositing a third non-doped polysilicon layer;

i) implanting dopants in the third non-doped polysilicon layer so as only to implant the upper part of the layer located in the zone showing the difference in the topography;

j) selective etching to only remove the part of the non-doped polysilicon layer located in the lower part of the zone; and k) etching to remove the entire remainder of the third polysilicon layer and the part of the upper electrode layer located in the lower part, with the removal of the upper electrode layer being self-aligned on the lower electrode.

BRIEF DESCRIPTION OF THE DRAWINGS

Other characteristics and advantages of the invention will be seen more clearly upon reading the following description of a specific example of the embodiment, with reference to the following figures, wherein.

DETAILED DESCRIPTION OF THE PREFERRED EMBODIMENTS

References of the common elements of the different figures are identical throughout the application. Numerical applications in the following description are only given as examples and must not be considered as a limitation of the scope of the invention.

The method according to the invention requires the implementation of the following sequence of specific operations. It is considered in this case that the access transistors, the insulation slots used to insulate the active zones from each other, and the tungsten interconnection levels have already been formed.

Figure 1:
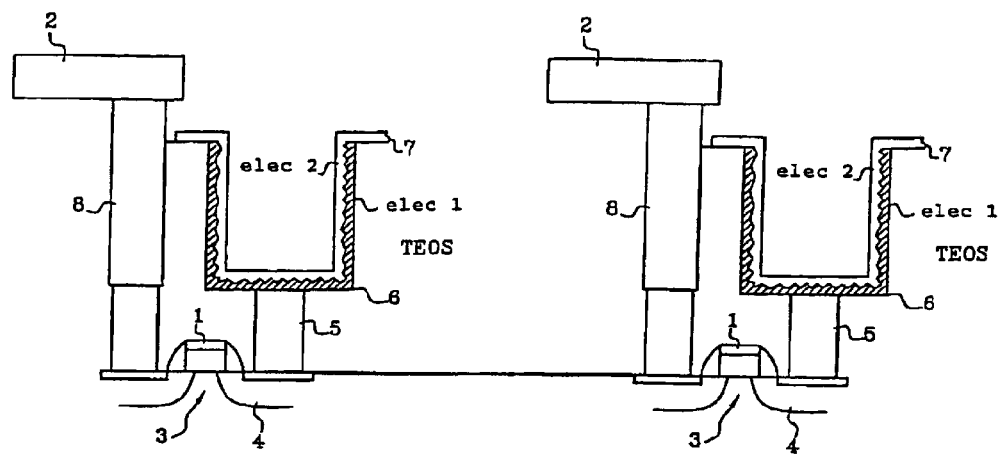
FIG. 1 is a diagram illustrating the architecture of an overlay type DRAM memory cell according to the prior art.
Figure 2:
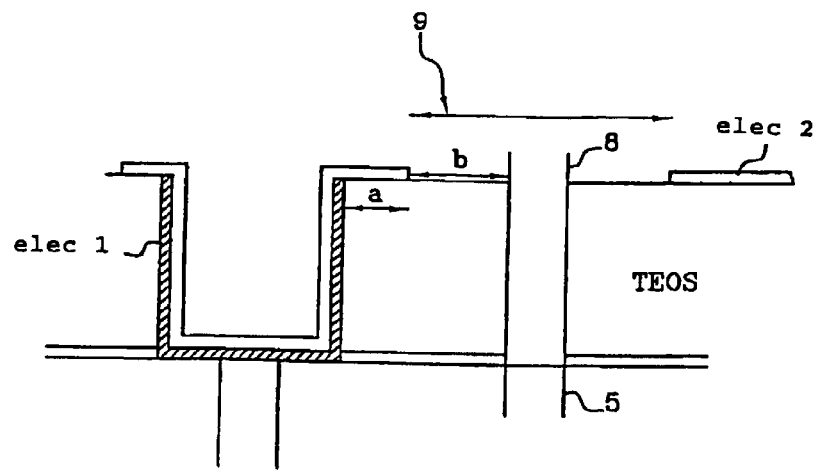
FIG. 2 is a diagram illustrating the steps to be implemented to insert the bit line contact in the architecture according to the prior art.
Figure 3:
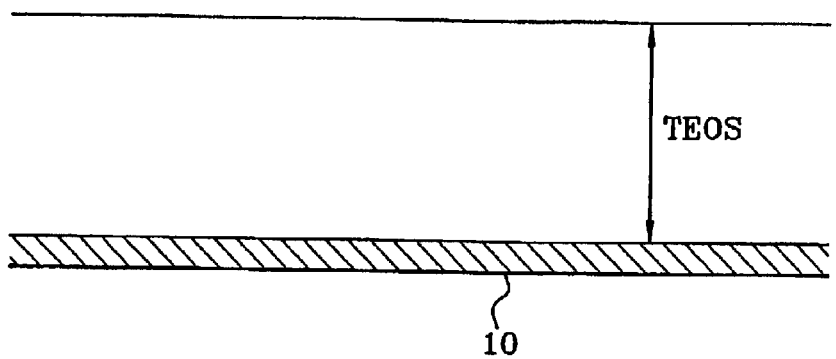
FIGS. 3 to 9 are diagrams illustrating the different steps of the method according to the invention.

With reference to FIG. 3, a first specific operation includes depositing a first $Si_3N_4$ silicon nitride layer 10 having a thickness of 800 Å (Angstrom) for example, followed by a silicon oxide layer TEOS having a thickness of 1.2 μm (micrometers). The height of the silicon oxide layer TEOS corresponds to the height of the cylinders for the capacitances since it is in this layer TEOS that the cylinders defining the capacitance of the cells will be etched. The thin $Si_3N_4$ layer 10 is used as a barrier layer for etching the layer TEOS. These two layers are deposited by implementing a plasma enhanced chemical vapor deposition (PECVD) method.

Figure 4:
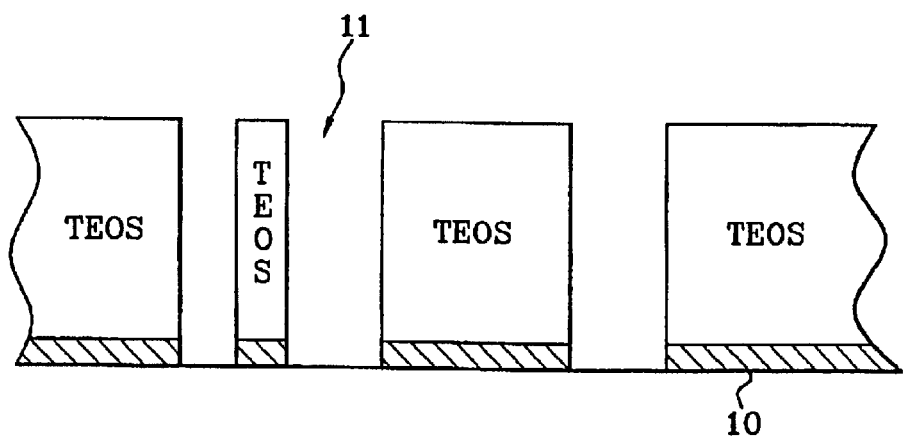

FIG. 4 shows the next photoetching operation used to define the cylinders 11 wherein the capacitances are to be formed. This operation uses a mask called elec 1 grid. Dry etching is used, i.e., etching using a plasma to corrode the surface to be engraved anisotropically.

The next operation includes depositing a first polysilicon layer to form the lower electrode elec 1 of the capacitance. To increase the surface developed by the capacitance without increasing the surface occupied, the lower electrode elec 1 is deposited in the form of hemispherical polysilicon grains using the HSG method.

Figure 5:
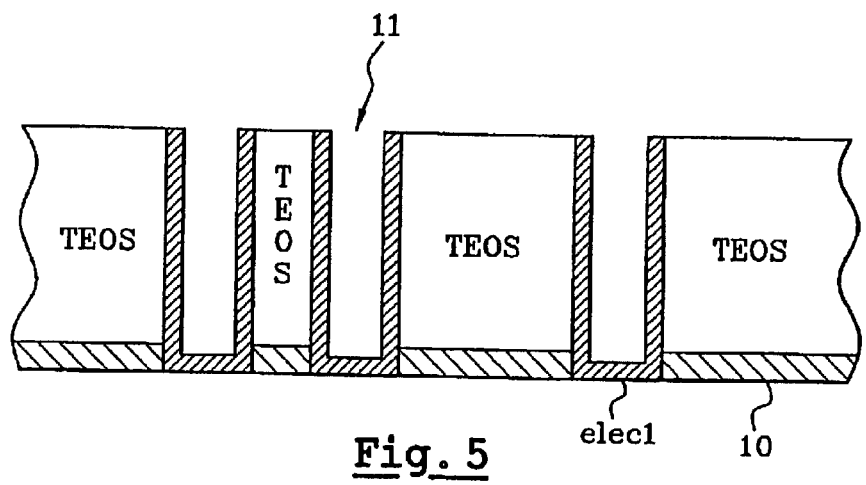

To remove the polysilicon between the different capacitances, mechanical-chemical polishing is performed. To avoid damaging the capacitances, resin is deposited to fill the cylinders 11. The resin and polysilicon is polished before cleaning the remaining resin. The lower electrode elec 1 is then defined and the structure shown in FIG. 5 is obtained.

At this stage, an original step of the method according to the present invention includes removing the silicon oxide layer TEOS. This removal is carried out by chemical etching to a thickness of about 4000 Å, and thus creates a difference in topography between each lower electrode elec 1 and the silicon oxide layer TEOS. The depth removed is defined by the etching time, as illustrated in FIG. 6.

Figure 6:
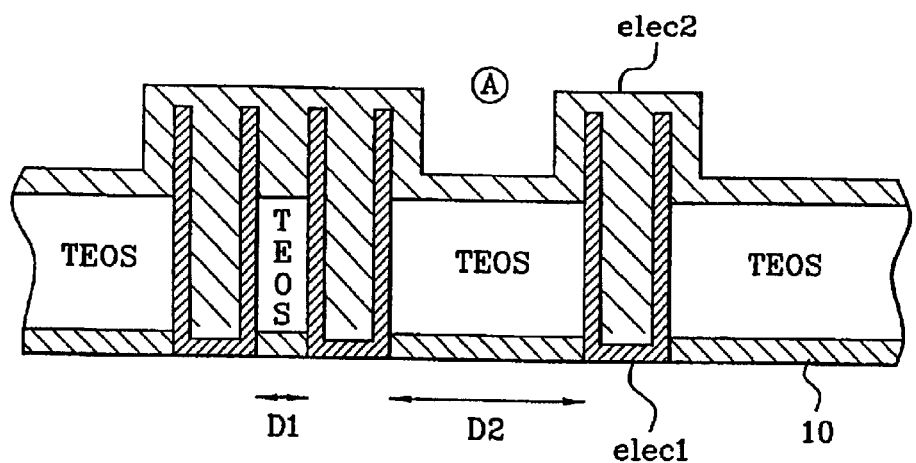

Once this removal is carried out, a dielectric layer dielec, as shown in FIG. 6, is deposited. The dielectric chosen is silicon nitride because of its high permittivity. This deposition is preceded by oxidation of the polysilicon. Therefore, the dielectric is formed from two layers, one oxide layer and one nitride layer. The dashed line within the dielectric layer dielec in FIG. 6 illustrates these two layers.

The next operation includes depositing a second polysilicon layer to form the upper electrode elec 2 of the capacitance. This deposition has a thickness of 1000 Å, is conforming and is doped with $N^+$ polysilicon. The upper electrode elec 2 represents a continuous electrode plate.

However, due to the geometry of the cell and the distances D1 and D2, and after the conforming deposition of polysilicon to define the electrode elec 2, the difference in topography is only retained in zone A (FIG. 6), where it is necessary to open the upper electrode plate elec 2 to insert the bit line contact.

The polysilicon layer elec 2 has a thickness of 1000 Å, and completely fills the cylinders of the capacitances and the inter-elec 1 space, which has a width Dl, with D1 being on the order of 2000 Å. The inter-elec 1 space of width D2, with D2 being on the order 7500 Å, which is much wider than D1 and is, therefore, not entirely blocked by the layer of polysilicon elec 2. The difference in topography produced by the removal of silicon oxide TEOS is retained only in zone A, i.e., the zone which must be opened to insert the bit line contact.

Figure 7:
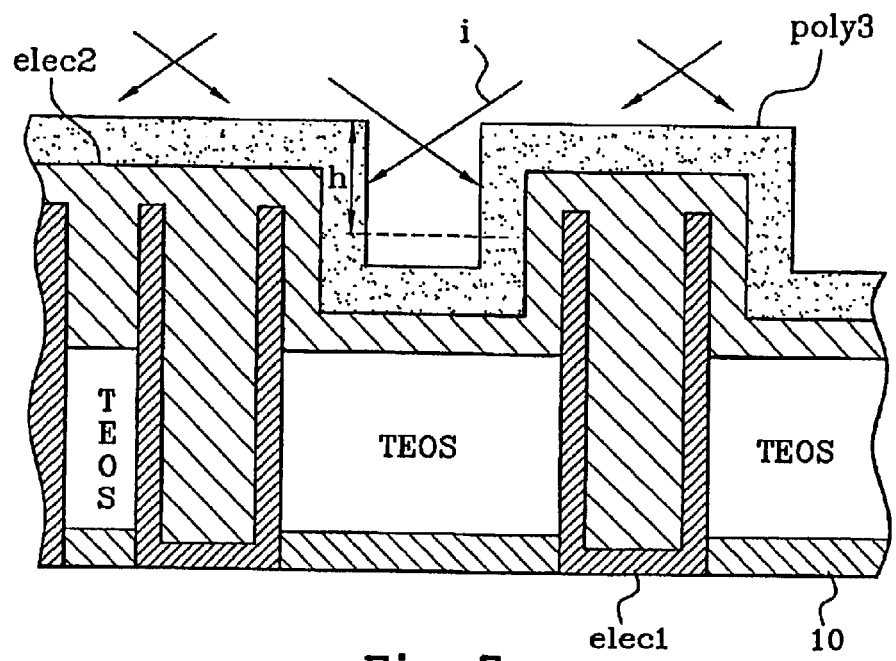

At this stage, it is therefore necessary to open the upper electrode plate elec 2 to insert the bit line contact in zone A. Therefore, it is necessary to remove the polysilicon from the layer elec 2 only in the lower part of zone A, and not in the upper part. FIG. 7 illustrates the sequence of operations to be implemented. A third non-doped polysilicon layer poly3 is deposited having a thickness of 1500 Å. Then, an ionic implantation is carried out to implant only the upper part of the polysilicon layer poly3 located in zone A that includes the difference in topography. For example, BF2 type dopants are used for the implantation.

Figure 8:
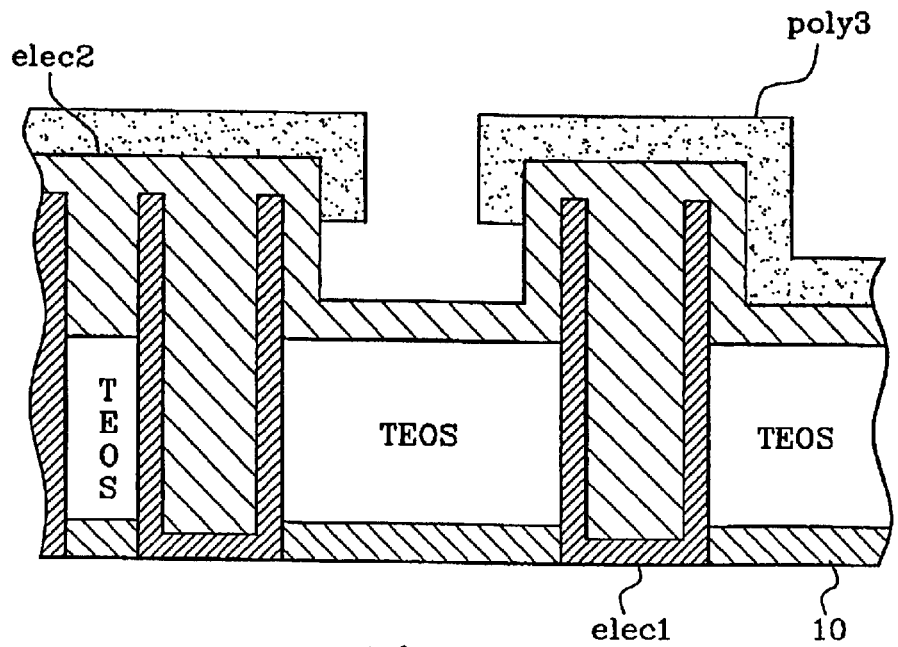

The depth and concentration of the implantation is controlled. A selective etching, such as wet etching, is then performed. It enables a selective removal of part of the non-doped polysilicon layer poly3 with respect to the part of the polysilicon layer implanted in the previous step (see FIG. 8). Wet solutions such as KOH or $NH_4OH$ may be used for the selective removal of the non-doped zones. Only the polysilicon layer poly3 located in the lower part of zone A is removed.

Figure 10:
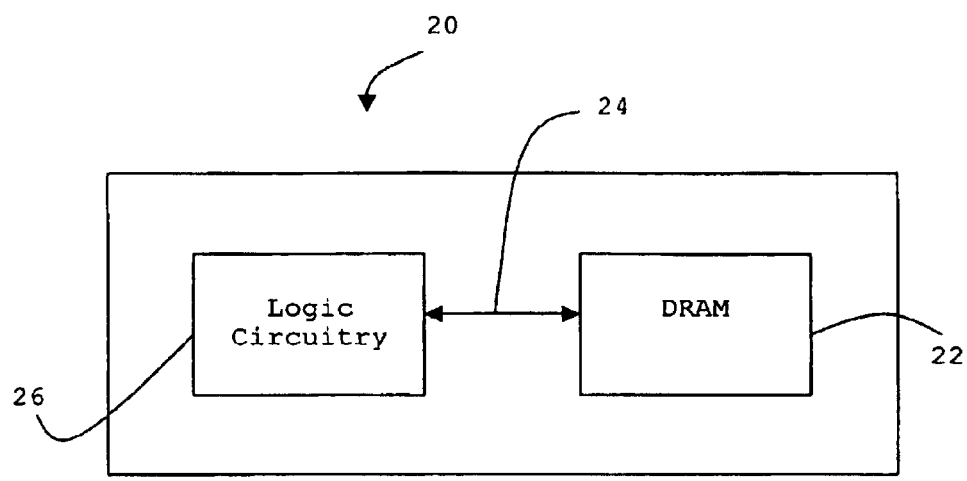
FIG. 10 is a block diagram of an integrated circuit with an embedded DRAM according to the invention.

According to a specific embodiment of the invention, the polysilicon layer poly3 implantation step is preceded by an additional step. This step is necessary when the method according to the invention is applied to the production of an embedded DRAM. The purpose of this step is to prevent the implantation of the polysilicon layer poly3 located in the logic zones of the chip. An integrated circuit 20 including an embedded DRAM 22 is illustrated in FIG. 10, for example. Bus 24 connects the embedded DRAM 22 to the logic circuitry 26.

A medium ultra violet (MUV) type mask is then used so that the polysilicon layer poly3 covering the logic circuits is not implanted. During the next selective removal step of the non-doped polysilicon layer poly3, the poly3 layer covering the logic zones and which were not implanted using the mask is removed. Since the zone to be protected by the MUV mask is large, this step is not subject to alignment constraints.

Figure 9:
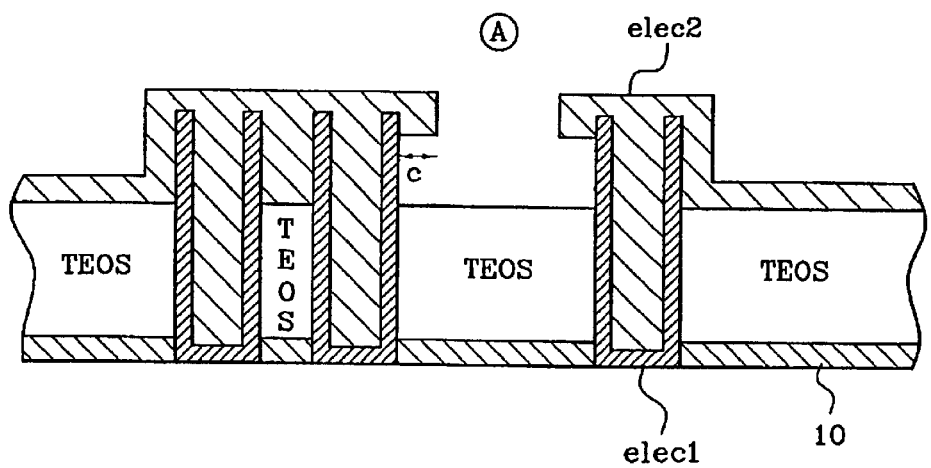

A final step includes performing a reactive ion etching (RIE). This etching may be carried out isotropically or anisotropically, however, isotropic etching is preferably used. By controlling the etching time, this step is used to remove the entire poly3 layer remaining and the part of the upper electrode elec 2 layer located in the lower part of zone A, which is therefore no longer covered by the poly3 layer following the previous selective removal step. The structure illustrated in FIG. 9 is then obtained.

The removal of the upper electrode layer elec 2 located in the lower part of zone A, i.e., the zone where the inter-elec 1 space is the widest and which is intended for the insertion of the bit line contact, is self-aligned with the lower electrode elec 1. The distance c from the removal of the upper electrode layer elec 2 to the polysilicon layer defining the electrode elec 1 is given by the thickness of the layer elec 2. Therefore, the removal of the layer elec 2 is always located at the same distance with respect to the lower electrode elec 1.

At this stage, the bit line contact remains opened. Either the cylinders of the capacitances are filled by depositing silicon oxide directly, or a nitride spacer is produced in the zone where the contact is to be inserted and filling is then performed by depositing silicon oxide. Mechanical-chemical polishing of the silicon oxide layer is then performed to planarize the surface. It is now necessary to perform the photoetching of the contact.

The method according to the invention makes it possible to obtain self-alignment of the removal of the upper electrode layer elec 2 with respect to the lower electrode elec 1 by forming a difference in topography at the point where the layer elec 2 is to be opened to insert the contact. It is then possible, using an angular implantation, to perform a selective removal between the upper and lower parts.

That which is claimed is:

1. A method for making a dynamic random access memory (DRAM) comprising a plurality of memory cells, each memory cell connected to a bit line and a word line and comprising a storage capacitor and an access transistor, the method comprising:

forming a barrier layer on a substrate, and forming a first dielectric layer on the barrier layer;

removing a portion of the first dielectric layer for defining a plurality of spaced apart openings therein;

forming a first metal layer on the first dielectric layer and in the plurality of openings;

removing the first metal layer from an upper surface of the first dielectric layer while leaving the first metal layer in the plurality of openings for forming lower electrodes of the respective storage capacitors;

removing an upper portion of the first dielectric layer to create a difference in topography between each lower electrode and the first dielectric layer;

forming a second dielectric layer on each lower electrode;

forming a second conductive layer on the second dielectric layer and on the first dielectric layer to form a continuous upper electrode, with the difference in topography being retained in zones where a portion of the upper electrode is to be removed so that a respective bit line contact can be formed;

forming a third conductive layer on the second conductive layer;

implanting dopants in the third conductive layer corresponding to an upper portion of the zones showing the difference in topography;

removing the third conductive layer corresponding to a lower portion of the zones; and removing the upper electrodes exposed in the lower portion of the zones, and completely removing a remainder of the third conductive layer, the removal of the upper electrodes being self-aligned with respect to the lower electrodes.

2. A method according to claim 1, further comprising forming a plurality of access transistors in the substrate.

3. A method according to claim 1, wherein each of the first and second dielectric layers comprises silicon oxide.

4. A method according to claim 1, wherein each of the first, second and third conductive layers comprises polysilicon.

5. A method according to claim 1, wherein the DRAN comprises an embedded DRAN; and further comprising using a mask so that the dopants are only implanted in the third conductive layer corresponding to the upper portion of the zones.

6. A method according to claim 1, wherein the first conductive layer forming the lower electrodes comprises hemispherical polystlicon grains.

7. A method according to claim 1, wherein removing the upper portion of the first dielectric layer is carried out by chemical etching, and a duration of the chemical etching determines a depth of the upper portion of the first dielectric layer being removed.

8. A method according to claim 1, wherein the second dielectric layer comprises an oxide layer and a nitride layer on the oxide layer.

9. A method according to claim 1, wherein the dopants comprise $BF_2$.

10. A method according to claim 1, wherein a wet solution comprising at least one of KOH and $NH_4OH$ is used for removing the third conductive layer.

11. A method according to claim 1, wherein removing the upper electrodes and the remainder of the third conductive layer is performed by a plasma ion etching.

12. A method according to claim 11, wherein the plasma ion etching is an isotropic plasma ion etching.

13. A method according to claim 11, wherein the plasma ion etching is an anisotropic plasma ion etching.

14. A method for making a dynamic random access memory (DRAN) comprising a plurality of memory cells, each memory cell connected to a bit line and a word line and comprising a storage capacitor and an access transistor, the method comprising:
   forming a plurality of access transistors in a substrate;
   forming a first dielectric layer on the substrate;
   defining a plurality of spaced apart openings in the first dielectric layer;
   forming lower electrodes for the respective storage capacitors in the plurality of spaced apart openings;
   removing an upper portion of the first dielectric layer to create a difference in topography between each lower electrode and the first dielectric layer;
   forming a second dielectric layer on each lower electrode;
   forming a continuous upper electrode for the respective storage capacitors on the first and second dielectric layers, with the difference in topography being retained in zones where a portion of the upper electrode is to be removed so that a respective bit line contact can be formed;
   forming a conductive layer on the continuous upper electrode;
   implanting dopants in the conductive layer corresponding to an upper portion of the zones showing the difference in topography;
   removing the conductive layer corresponding to a lower portion of the zones; and
   removing the upper electrodes exposed in the lower portion of the zones, and completely removing a remainder of the conductive layer, the removal of the upper electrodes being self-aligned with respect to the lower electrodes.

15. A method according to claim 14, wherein the DRAM comprises an embedded DRAM; and further comprising using a mask so that the dopants are only implanted in the conductive layer corresponding to the upper portion of the zones.

16. A method according to claim 14, wherein the lower electrodes comprises hemispherical polysilicon grains.

17. A method according to claim 14, wherein removing the upper portion of the first dielectric layer is carried out by chemical etching, and a duration of the chemical etching determines a depth of the upper portion of the first dielectric layer being removed.

18. A method according to claim 14, wherein the second dielectric layer comprises an oxide layer and a nitride layer on the oxide layer.

19. A method according to claim 14, wherein a wet solution comprising at least one of KOH and $NH_4OH$ is used for removing the conductive layer.

20. A method according to claim 14, wherein removing the upper electrodes and the remainder of the conductive layer is performed by a plasma ion etching.

21. A method for making a dynamic random access memory (DRAM) comprising a plurality of memory cells, each memory cell connected to a bit line and a word line and comprising a storage capacitor and an access transistor, the method comprising:
   forming a plurality of access transistors in a substrate;
   forming a first dielectric layer on the substrate;
   defining a plurality of spaced apart openings in the first dielectric layer;
   forming lower electrodes for the respective storage capacitors in the plurality of spaced apart openings;
   removing an upper portion of the first dielectric layer to create a difference in topography between each lower electrode and the first dielectric layer;
   forming a second dielectric layer on each lower electrode;
   forming a continuous upper electrode for the respective storage capacitors on the first and second dielectric layers, with the difference in topography being retained in zones where a portion of the upper electrode is to be removed so that a respective bit line contact can be formed; and
   removing the upper electrodes exposed in a lower portion of the zones, the removal of the upper electrodes being self-aligned with respect to the lower electrodes.

22. A method according to claim 21, wherein the lower electrodes comprises hemispherical polysilicon grains.

23. A method according to claim 21, wherein removing the upper portion of the first dielectric layer is carried out by chemical etching, and a duration of the chemical etching determines a depth of the upper portion of the first dielectric layer being removed.

24. A method according to claim 21, wherein the second dielectric layer comprises an oxide layer and a nitride layer on the oxide layer.

25. A method according to claim 21, wherein removing the upper electrodes is performed by a plasma ion etching.

* * * * *

UNITED STATES PATENT AND TRADEMARK OFFICE
CERTIFICATE OF CORRECTION

PATENT NO. : 6,759,304 B2
DATED : July 6, 2004
INVENTOR(S) : Philippe Coronel, Marc Piazza and Françcois Leverd It is certified that error appears in the above-identified patent and that said Letters Patent is hereby corrected as shown below:

Column 6,
Lines 60 and 61, delete "DRAN" insert -- DRAM --
Line 67, delete "polystlicom" insert -- polysilicon --

Column 7,
Line 21, delete "DRAN" insert -- DRAM --

Signed and Sealed this

Nineteenth Day of April, 2005

JON W. DUDAS
*Director of the United States Patent and Trademark Office*